United States Patent
Bakal et al.

(10) Patent No.: US 12,100,725 B2
(45) Date of Patent: Sep. 24, 2024

(54) GERMANIUM BASED FOCAL PLANE ARRAY FOR THE SHORT INFRARED SPECTRAL REGIME

(71) Applicant: TriEye Ltd., Tel Aviv (IL)

(72) Inventors: Avraham Bakal, Tel Aviv (IL); Uriel Levy, Tel Aviv (IL); Omer Kapach, Tel Aviv (IL)

(73) Assignee: TriEye Ltd., Tel Aviv (IL)

( * ) Notice: Subject to any disclaimer, the term of this patent is extended or adjusted under 35 U.S.C. 154(b) by 0 days.

(21) Appl. No.: 18/326,123

(22) Filed: May 31, 2023

(65) Prior Publication Data

US 2023/0307477 A1   Sep. 28, 2023

Related U.S. Application Data

(63) Continuation of application No. 17/359,527, filed on Jun. 26, 2021, now Pat. No. 11,705,469, which is a continuation of application No. 16/470,252, filed as application No. PCT/IB2019/050030 on Jan. 2, 2019, now Pat. No. 11,063,079.

(60) Provisional application No. 62/615,198, filed on Jan. 9, 2018.

(51) Int. Cl.
*H01L 27/146* (2006.01)
*H01L 31/0232* (2014.01)
*H01L 31/028* (2006.01)
*H01L 31/18* (2006.01)

(52) U.S. Cl.
CPC .. *H01L 27/14627* (2013.01); *H01L 27/14643* (2013.01); *H01L 31/02327* (2013.01); *H01L 31/028* (2013.01); *H01L 31/1804* (2013.01)

(58) Field of Classification Search
CPC ............ H01L 31/02327; H01L 31/028; H01L 31/1804
See application file for complete search history.

(56) References Cited

PUBLICATIONS

Hui Cong et al., "High-speed waveguide-integrated Ge/Si avalanche photodetector", 2016, Chinese Phys. B, vol. 25, 058503.*

* cited by examiner

*Primary Examiner* — Suberr L Chi
(74) *Attorney, Agent, or Firm* — Nathan & Associates; Menachem Nathan

(57) ABSTRACT

Light detecting structures comprising a Si base having a pyramidal shape with a wide incoming light-facing pyramid bottom and a narrower pyramid top and a Ge photodiode formed on the Si pyramid top, wherein the Ge photodiode is operable to detect light in the short wavelength infrared range, and methods for forming such structures. A light detecting structure as above may be repeated spatially and fabricated in the form of a focal plane array of Ge photodetectors on silicon.

17 Claims, 2 Drawing Sheets

GERMANIUM BASED FOCAL PLANE ARRAY FOR THE SHORT INFRARED SPECTRAL REGIME

CROSS REFERENCE TO RELATED APPLICATIONS

This application is a continuation of U.S. patent application Ser. No. 17/359,527 filed Jun. 26, 2021 (now allowed), which was application is a continuation of U.S. patent application Ser. No. 16/470,252 filed Jun. 17, 2019 (now U.S. Pat. No. 11,063,079), which was a 371 application from international patent application PCT/IB2019/050030 filed Jan. 2, 2019 and claims the benefit of priority from U.S. Provisional patent application No. 62/615,198 filed Jan. 9, 2018, which is incorporated herein by reference in its entirety.

FIELD

Embodiments disclosed herein relate in general to focal plane arrays (FPAs) in the short wave infrared (SWIR) spectral regime, and in particular to a method for forming such FPAs based on Germanium (Ge) detectors.

BACKGROUND

Imaging systems operating in the SWIR (generally defined to be between about 1000-2500 nm wavelength) are attracting growing attention due to numerous reasons. For example, compared to visible range, light in SWIR range is less sensitive to extreme weather conditions such as fog and dust. Moreover, the SWIR wavelength range is invisible to the human eye. Additionally, eye safety regulations allow use of high power active illumination sources in the SWIR range. Such advantages, combined with the fact that unlike in thermal imaging the image contrast mechanisms for SWIR resemble that of the visible range, thus allowing use of conventional image recognition algorithms, render the SWIR regime an attractive alternative to the visible range for imaging purposes.

Known FPAs in the SWIR range are typically made using the InGaAs material system. While the performance envelope of InGaAs based FPAs is attractive, the cost of such FPAs is high, preventing their use in many consumer market applications.

There is a need for, and it would be advantageous to have, SWIR photodetectors and FPAs based on silicon and other group IV materials, providing high performance at low cost, and methods to fabricate such SWIR photodetectors and FPAs.

SUMMARY

Embodiments disclosed herein relate to low cost, high performance light detecting structures for detecting light in the SWIR regime, and methods for fabricating such structures.

In exemplary embodiments, there are provided light detecting structures comprising a Si base having a pyramidal shape with a wide incoming light-facing pyramid bottom and a narrower pyramid top, and Ge photodiode formed on the Si pyramid top, wherein the Ge photodiode is operable to detect light in the SWIR range.

In an exemplary embodiment, the Ge photodiode includes a p-n junction.

In an exemplary embodiment, the Ge photodiode includes a p-i-n junction.

In an exemplary embodiment, a light detecting structure described above or below further comprises a microlens placed between the pyramid bottom and the incoming light.

In an exemplary embodiment, a light detecting structure described above or below further comprises an anti-reflection layer positioned between the pyramid bottom and the microlens.

In an exemplary embodiment, the pyramid bottom is a square of about 10×10 micrometer squared ($\mu m^2$). In an exemplary embodiment, the pyramid bottom is a square of about 20×20 $\mu m^2$.

In an exemplary embodiment, the pyramid top is a square of about 1×1 $\mu m^2$. In an exemplary embodiment, the pyramid top is a square between about 1×1 $\mu m^2$ to about 10×10 $\mu m^2$.

In an exemplary embodiment, a light detecting structure described above or below is repeated spatially to provide a plurality of Ge photodiodes formed on respective Si pyramid tops to form a FPA.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure are generally labeled with a same numeral in all the figures in which they appear. The drawings and descriptions are meant to illuminate and clarify embodiments disclosed herein, and should not be considered limiting in any way. In the drawings.

DETAILED DESCRIPTION

In the following detailed description, numerous specific details are set forth in order to provide a thorough understanding. However, it will be understood by those skilled in the art that the presently disclosed subject matter may be practiced without these specific details. In other instances, well-known methods have not been described in detail so as not to obscure the presently disclosed subject matter.

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable subcombination.

Figure 1:
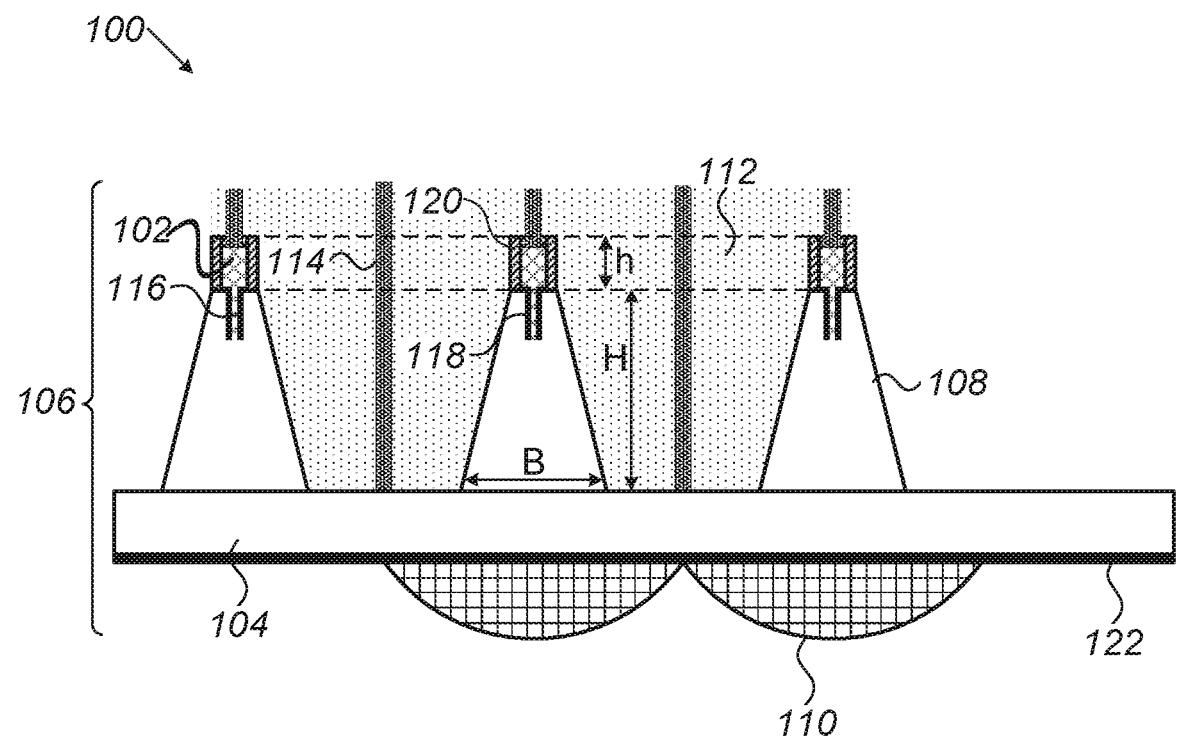
FIG. 1 illustrates schematically in a side view an embodiment of a Ge-based photosensitive structure disclosed herein.

FIG. 1 illustrates schematically in a side view an embodiment of a Ge-based photosensitive (PS) structure disclosed herein, numbered 100. Structure 100 includes a layer 102 of a Ge absorbing medium grown on a doped Si substrate (wafer) 104, a light collecting structure 106 including silicon pyramids 108 integrally formed in the Si wafer, an insulating oxide 112 that fills the gap between adjacent pyramids 108, and electrically conductive contacts 114 for electrically connecting one or more Ge photodetectors (also referred to next as "Ge photodiode" or simply "Ge diode") 120 to the outside world. FIG. 1 also shows a growth seed 116 etched into the silicon substrate to support crystalline growth of the Ge layer and to trap threading dislocations (not shown). The trapping prevents the dislocations from propagating into the Ge layer above the seed, thus improving the quality of the Ge layer. The seed is protected by a thin oxide layer 118 on all sides except at its bottom, which is exposed to the growth chemistry. This is done to ensure that the Ge crystalline growth originates from the bottom of the seed.

In more detail, each Si pyramid 108 is formed with a large base "B" on wafer 104. The base may have a square shape with exemplary dimensions of 10×10 $\mu m^2$ or more, e.g. up to 20×20 $\mu m^2$. The square shape and the dimensions of the pyramid top are exemplary, and other shapes (for example rectangular) or dimensions are possible. Ge diode 120 (e.g. with a p-n structure or a p-i-n structure) is formed on a narrower top of the pyramid. Each pyramid collects light impinging on the large base (B) and confines the light to the smaller dimension of the Ge diode. For example, the Ge diode has lateral dimensions from about 1 $\mu m$ to a few (e.g. about 2, 3, 4 and even 10) $\mu m$. The thickness of the Ge layer h may be about 1 $\mu m$ or larger and is chosen such that significant absorption (e.g. larger than 30% at a 1500 nm wavelength) of SWIR light is achieved. Since the size of the Ge diode is small compared to that of the Si pyramid base, the dark current component, which is proportional to the volume of the absorption media, is greatly reduced. An array of microlenses 110 can optionally be placed below the pyramids to further improve the light collection efficiency. An anti-reflection layer (AR) 122 can optionally be added to reduce the reflection of light impinging on the FPA.

In operation, light propagates through each Si pyramid 108, which is transparent in the SWIR wavelength range. As the light arrives at the top of the Si pyramid, it penetrates into Ge diode 120. The light absorbed by the Ge layer generates electron-hole pairs, which are separated by the diode structure under the application of reverse bias or even without bias in well-known ways, resulting in useful photocurrent that provides photo detection.

Figure 2:
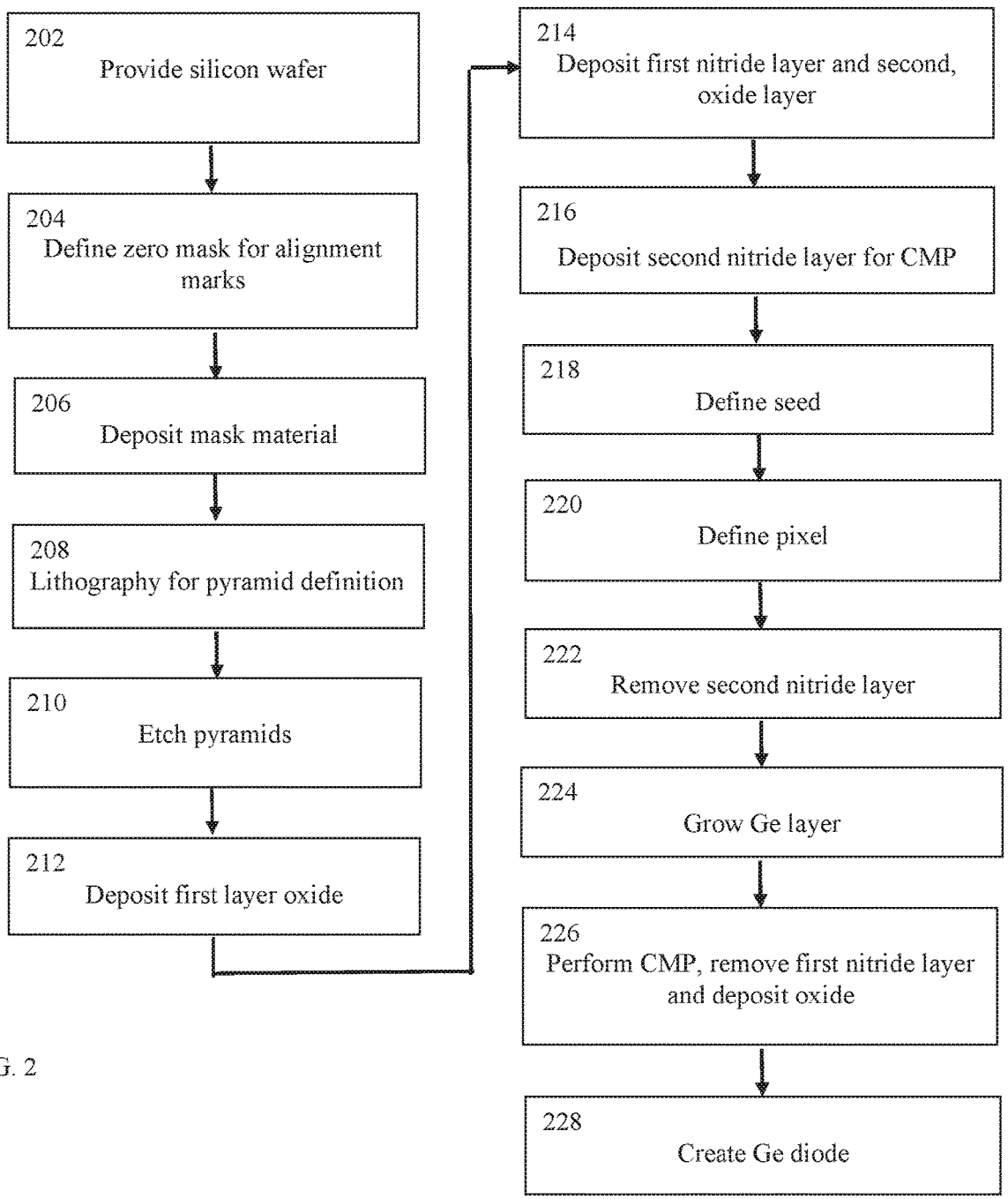
FIG. 2 illustrates schematically main steps in a method of fabricating a Ge-based FPA disclosed herein.

A structure comprising one Si pyramid with the Ge diode on top and surrounded by oxide may be considered to be a single "active pixel". This structure may be repeated spatially many times, to provide an array of active pixels that thus form the photosensitive wafer of the FPA. FIG. 2 illustrates schematically main steps in a method of fabricating a Ge-based FPA disclosed herein. In step 202, a silicon wafer with {100} crystallographic plane orientation, preferably double polished, is provided as a starting material. The wafer is provided with a thin oxide (~10 nm oxide thickness) that protects the surface of the silicon from the following lithography process. In step 204, lithography and etching are performed to define alignment marks in the silicon. In step 206, a pyramid pattern mask is defined, e.g. by depositing a first thin silicon nitride layer (or any other layer that can be used as a mask for etching process) on top of the thermally grown oxide. In step 208, the dimensions of the pyramid base are defined (e.g. as square shapes from about 10×10 $\mu m^2$ and up to about 20×20 $\mu m^2$) using photolithography and etching of the silicon nitride layer. The silicon pyramids may be created in step 210 either by anisotropic etching with potassium hydroxide (KOH) solution or by reactive ion etching (RIE), the latter achieved by controlling the RIE parameters in a known way to provide the desired profile. In step 212, a thick silicon oxide layer is deposited (e.g. using plasma enhanced chemical vapor deposition (CVD)) to fill the voids between the pyramids. The structure is planarized, e.g. by chemical mechanical polishing (CMP) such that the oxide is planar with the top of the silicon pyramid. In step 214, a second thin layer of nitride deposition, followed by a second step of oxide deposition is performed up to the desired thickness of the Ge diode (h in FIG. 1). In step 216, a third thin nitride layer is deposited after the oxide deposition to provide selectivity in in a following CMP process. This third nitride layer is typically thicker than the second nitride layer. In step 218, the growth seed pattern is defined. First, the seed structure is created by performing lithography and etching through the third nitride, oxide and second nitride layers and down into the silicon (e.g. about 1 $\mu m$ into the silicon). A typical width of the seed can range from few hundreds of nanometers to about 1 $\mu m$. In step 220, the lateral dimensions of the Ge diode are defined by performing lithography and etching to remove the third nitride layer and the oxide below it.

Next, the sidewalls of the seed are protected by performing a short oxidation step, followed by ME, which exposes the bottom of the seed. In step 222, the second nitride layer of each pixel is removed by RIE of by wet chemical etching without the need to use a lithographic mask. As a result, some of the third nitride is also removed. However, since the third nitride layer was thicker than the second nitride layer, some of it still remains and is used later on as a stop layer for the CMP process.

In step 224, the Ge layer is grown using for example known CVD processes, see e.g. "Germanium epitaxy on silicon", Sci. Technol. Adv. Mater. 15 (2014) 024601. In step 226, another CMP process is performed to planarize the Ge layer. The nitride layer is removed, and a few micrometers of oxide are deposited for passivation and for preparation for metallization. In step 228, the Ge diodes are defined by creating a pn junction or p-i-n junction using standard processes of doping, e.g. ion implantation or diffusion and dopant activation, see e.g. "Waveguide-integrated vertical pin photodiodes of Ge fabricated on p+ and n+ Si-on-insulator layers" Japanese Journal of Applied Physics 56, 04CH05 (2017) for p-i-n, and "High-Performance Ge p-n Photodiode Achieved With Preannealing and Excimer Laser Annealing" IEEE Photonics Technology Letters (Vol. 27, Issue 14, pp. 1485-1488 (2015) for pn.

In an exemplary embodiment, the doping of the central region of the Ge photodetector can be n type, where the surrounding highly doped regions are p+ doped. Alternatively, the doping polarity can be reversed, where the as-grown bulk Ge is p type, while the surrounding of the Ge diode is n+ doped. The doping is followed by contact definition and metallization to complete the Ge diodes array (i.e. the FPA).

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element.

All references mentioned in this specification are herein incorporated in their entirety by reference into the specification, to the same extent as if each individual reference was specifically and individually indicated to be incorporated herein by reference. In addition, citation or identification of any reference in this application shall not be construed as an admission that such reference is available as prior art to the present disclosure.

What is claimed is:

1. A method of manufacturing a focal plane array (FPA), comprising:
   defining dimensions of a plurality of pyramid bases in a Silicon (Si) wafer;
   creating a plurality of Si pyramids in the Si wafer, each Si pyramid associated with a respective pyramid base and having a truncated top;
   growing a Germanium (Ge) layer on the Si wafer with the Si pyramids;
   doping the Ge layer; and
   in the doped Ge layer, creating a plurality of separate Ge diodes on the Si pyramid truncated tops, thereby forming a Ge-based FPA.

2. The method of claim 1, wherein the defining of the dimensions of the plurality of pyramid bases comprises defining the dimensions using photolithography and etching of a silicon nitride layer deposited on top of an oxide layer of the Si wafer.

3. The method of claim 2, wherein each pyramid base has a rectangular shape with four edges ranging between 10 μm and 20 μm.

4. The method of claim 1, wherein the creating of the plurality of Si pyramids comprises creating the Si pyramids using anisotropic etching with a potassium hydroxide (KOH) solution.

5. The method of claim 1, wherein the creating of the plurality of Si pyramids comprises creating the Si pyramids using reactive ion etching (RIE).

6. The method of claim 1, wherein the Ge layer is a light absorbing medium.

7. The method of claim 1, wherein lateral dimensions of the Ge diodes are between 1 μm and 10 μm.

8. The method of claim 1, wherein the thickness of the Ge layer is about 1 μm.

9. The method of claim 1, wherein the providing comprises providing a Si wafer with {100} crystallographic plane orientation.

10. The method of claim 1, wherein the growing of the Ge layer comprises growing the Ge layer using chemical vapor deposition.

11. The method of claim 1, wherein each Ge diode comprises creating a pn junction.

12. The method of claim 1, wherein each Ge diode comprises creating a p-i-n junction.

13. The method of claim 1, wherein the doping of the Ge layer comprises doping the Ge layer by ion implantation.

14. The method of claim 1, wherein the creating of the plurality of Si pyramids is followed by depositing a thick silicon oxide layer on the Si wafer for filling voids between the Si pyramids, planarizing a top layer of the Si wafer such that the silicon oxide has a top plane planar with tops of the Si pyramids, and depositing at least one nitride layer on the top plane, and wherein the growing of the Ge layer follows the depositing of the at least one nitride layer.

15. The method of claim 1, wherein the doping comprises doping the Ge layer such that a central region of each Ge diode is doped n type surrounded by highly doped p+ type regions.

16. The method of claim 1, wherein the doping comprises doping the Ge layer such that a central region of each Ge diode is doped p type surrounded by highly doped n+ type regions.

17. The method of claim 1, comprising, prior to the growing of the Ge layer, defining for each of the plurality of silicon pyramids a growth seed pattern using at least lithography and etching, oxidizing the defined growth seed pattern, and etching the oxidized defined growth seed pattern for exposing a bottom of the growth seed pattern, wherein the growing comprises growing the Ge layer starting from within the growth seed patterns.

* * * * *